United States Patent
Li et al.

(10) Patent No.: US 6,896,304 B2
(45) Date of Patent: May 24, 2005

(54) AUTOMATIC SENSING WAFER BLADE AND METHOD FOR USING

(75) Inventors: Hsiao-Yi Li, Chiai (TW); Chin-Hsin Peng, Hsin-Chu (TW); Cheng-Shun Chan, Tainan (TW); Jiann-Sheng Chang, Hsinchu (TW); Chung-Hao Tseng, Hsinchu (TW); Chien-Ling Huang, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 92 days.

(21) Appl. No.: 10/234,068

(22) Filed: Sep. 3, 2002

(65) Prior Publication Data

US 2004/0041421 A1 Mar. 4, 2004

(51) Int. Cl.⁷ .............................................. B25J 15/06
(52) U.S. Cl. ...................... 294/64.1; 294/907; 414/941; 901/40; 901/46
(58) Field of Search .............................. 294/64.1, 64.2, 294/64.3, 65, 907; 414/627, 737, 752.1, 941; 901/40, 46

(56) References Cited

U.S. PATENT DOCUMENTS

| | | | | | |
|---|---|---|---|---|---|
| 3,154,306 | A | * | 10/1964 | Elliott et al. | 271/106 |
| 3,272,549 | A | * | 9/1966 | Nisula | 294/64.1 |
| 5,192,070 | A | * | 3/1993 | Nagai et al. | 271/90 |
| 6,199,927 | B1 | * | 3/2001 | Shamlou et al. | 294/64.1 |
| 6,279,976 | B1 | * | 8/2001 | Ball | 294/64.1 |
| 6,517,130 | B1 | * | 2/2003 | Donoso et al. | 294/64.1 |

* cited by examiner

Primary Examiner—Dean J. Kramer
(74) Attorney, Agent, or Firm—Tung & Associates

(57) ABSTRACT

An automatic sensing wafer blade for picking up wafers that is equipped with a sensor capable of self-diagnosing potential failure conditions of the blade and a method for using the wafer blade are described. The automatic sensing wafer blade is equipped with a V-shaped seal ring on a top surface, and a sensor of either a limit switch or a capacitance sensor for sensing the presence or absence of a wafer on top of the wafer blade. The automatic sensing wafer blade is further capable of self-diagnosing any potential failure conditions of the function of the wafer blade due to contaminating particles, or contaminating liquid on the wafer surface, or due to an aged or malfunctioning seal ring on top of the wafer blade.

18 Claims, 2 Drawing Sheets

AUTOMATIC SENSING WAFER BLADE AND METHOD FOR USING

FIELD OF THE INVENTION

The present invention generally relates to a wafer blade for use in semiconductor processing and more particularly, relates to an automatic sensing wafer blade that is capable of sensing the presence or absence of a wafer positioned on top and a method for using the blade.

BACKGROUND OF THE INVENTION

In the fabrication of semiconductor devices, wafers of semiconducting nature, such as silicon wafers, must be processed through a multiplicity of fabrication steps which can amount to several hundred steps for a complicated IC device. For instance, a wafer is normally processed through a variety of fabrication steps which may include oxidation, dielectric layer deposition, stress relief and annealing, ion implantation, planarization, chemical-mechanical-polishing, etc. In each of these processing steps, the wafers are processed either singularly or in batches by loading them into a process machine or a wafer boat that can hold up to 24 wafers and then processing them in a horizontal or in a vertical processing chamber. The wafers can also be processed singularly in fabrication chambers that only process one wafer at a time. In-between the processes, the wafers are stored in a wafer storage cassette. One of such popularly used cassettes can hold up to 24 wafers vertically positioned in the cassette. The wafer must be picked-up by a suitable tool for loading or unloading into or from a wafer storage cassette to either a wafer boat or a process chamber for processing a single wafer, or for transferring between process tools.

Wafer pick-up tools of various configurations have been designed and utilized for handling wafers in a semiconductor fabrication facility. Since wafers are processed in a clean room environment and cannot tolerate the presence of any contaminants, a wafer pick-up tool must be designed to satisfy this important requirement. It is expected that most mechanical pick-up devices, e.g., a clamping device, would generate contaminants due to its mechanical contact with a wafer surface. Consequently, a pick-up device that utilizes vacuum for contacting and holding the wafer is more desirable. Most commercially available vacuum pick-up devices consist of a handle and a fixed-position pick-up head.

A vacuum pick-up device may also be used for wafers in-between process stations in an electrochemical plating process. In such a process, a wafer must be transferred in-between acid and alkali tanks for conducting various plating steps. During the various plating steps, the surface of the wafer is frequently contaminated with particles or acid/alkali solutions which may greatly affect the efficiency of the vacuum pick-up process. It is therefore desirable to provide a vacuum pick-up tool for wafers that not only can pick up wafers, but also is can detect the status of the vacuum used for the pick-up and alert the operator of any possible failure. The vacuum pick-up device can also detect when a wafer is stuck on the pick-up device due to adhesion of contaminating liquids on the surface of the pick-up device.

It is therefore an object of the present invention to provide an automatic sensing wafer blade for picking up wafers that does not have the drawbacks or shortcomings of the conventional wafer pick-up blades.

It is another object of the present invention to provide an automatic sensing wafer blade for picking up wafers that is capable of indicating a status of the vacuum pick-up process.

It is a further object of the present invention to provide an automatic sensing wafer blade for picking up wafers that is capable of predicting a potential failure of a seal ring on the pick-up blade.

It is another further object of the present invention to provide an automatic sensing wafer blade for picking up wafers that is capable of detecting contaminating particles on the surface of the pick-up blade.

It is still another object of the present invention to provide an automatic sensing wafer blade for picking up wafers that is capable of detecting contaminating liquids on the surface of the pick-up blade.

It is yet another object of the present invention to provide an automatic sensing wafer blade for picking up wafers that is equipped with at least one sensor of a limit switch.

It is still another further object of the present invention to provide an automatic sensing wafer blade for picking up wafers that is equipped with at least one sensor that is a capacitance sensor.

It is yet another further object of the present invention to provide an automatic sensing wafer blade for picking up wafers that is equipped with a V-shaped seal ring on the surface of the pick-up blade for functioning as a vacuum seal.

SUMMARY OF THE INVENTION

In accordance with the present invention, an automatic sensing wafer blade for picking up wafers and a method for using the blade are disclosed.

In a preferred embodiment, an automatic sensing wafer blade for picking-up wafers is provided which includes a blade body of generally circular shape that has a first thickness; a blade handle of elongated shape integral at one end with the blade body, the blade handle has a second thickness; a first plurality of stops formed on a top surface of the blade body circumferentially spaced-apart from each other adapted for contacting a bottom surface of a wafer; a seal ring circumferentially situated on the top surface of the blade body; a second plurality of vacuum holes in the top surface of the blade body situated within the seal ring; the second plurality of vacuum holes in fluid communication with a vacuum passageway in the blade body and the blade handle; and at least one sensor mounted on the top surface of the blade body situated within the seal ring for sensing the presence of a wafer positioned on the top surface of the blade body.

In the automatic sensing wafer blade for picking-up wafers, the seal ring may have a V-shaped cross-section, or the seal ring may have a V-shaped cross-section fabricated of an elastomer. The at least one sensor may be a capacitance sensor or may be a limit switch. The seal ring may have a height larger than a thickness of the first plurality of stops, or may have a height that is larger than a thickness of the at least one sensor mounted on the top surface of the blade body. The first plurality of stops may be formed of a material that has an elasticity sufficiently large to prevent the imposition of an impact load onto the wafer during a wafer pick-up process. The first plurality of stops may be formed of a rubber material. The automatic sensing wafer blade may further include a recording device for recording the status of detection of a wafer on top of the at least one sensor.

The present invention is further directed to a method for picking-up wafers by an automatic sensing wafer blade that can be carried out by the operating steps of first providing a wafer blade that has a blade body, a blade handle integrally formed with the blade body, a first plurality of stops formed on a top surface of the blade body, a seal ring circumferentially situated on the top surface of the blade body; a second plurality of vacuum holes in the top surface of the blade body situated within the seal ring; the second plurality of vacuum holes in fluid communication with a vacuum passageway in the blade body and the blade handle, and at least one sensor mounted on the top surface of the blade body situated within the seal ring; then withdrawing air from the second plurality of vacuum holes while positioning a wafer on top of the blade body; and monitoring an electronic signal produced by the at least one sensor to verify the proper functioning of the wafer blade.

The method for picking-up wafers by an automatic sensing wafer blade may further include the step of withdrawing air from the second plurality of vacuum holes in two separate steps, or the step of controlling the withdrawing of air from the second plurality of vacuum holes by a two-stage vacuum valve.

The method may further include the step of providing the first plurality of stops fabricated of a material that has sufficient elasticity so as not to impact a wafer during the pick-up process, or the step of providing the first plurality of stops fabricated of an elastomer. The method may further include the step of providing the at least one sensor in a limit switch, or in a capacitance sensor, or in a touch sensor. The method may further include the step of testing the sealing efficiency of the seal ring, or the step of testing for particle contamination on the top surface of the blade body, or the step of testing for liquid chemical contamination on the top surface of the blade body.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an automatic sensing wafer blade that is equipped with a sensor on the blade surface for picking up wafers and a method for using the wafer blade.

The automatic sensing wafer blade can be constructed by a blade body of circular shape, a blade handle of elongated shape, a plurality of stops on top of the blade body, a seal ring circumferentially situated on the top surface of the blade body; a plurality of vacuum holes in the top surface of the blade body inside the seal ring, and at least one sensor mounted on the blade body.

In the recent development of fabrication technology for 300 mm wafers, the transfer of the large wafers has become more difficult due to both the size and the weight of the wafers. When a vacuum blade is used to transfer the 300 mm wafers in-between plating tanks wherein the wafers may be contaminated with plating solutions on top, the task becomes even more difficult. The present invention automatic sensing wafer blade is thus provided which is capable of not only picking 300 mm wafers, but also monitoring the vacuum pick-up process and thus predict any potential failure conditions. The present invention automatic sensing wafer blade can be used to transfer wafers without the wafer-stuck or wafer-lost problems; can be used to detect contamination or possible corrosion of the wafer blade by acid or alkali solutions; and can detect a deterioration in the seal ring when the seal ring is aged and needs replacement.

The present invention automatic sensing wafer blade utilizes vacuum to catch and transfer wafers, and to utilizes a vacuum dish of circular shape equipped with a V-shaped seal ring to enhance the vacuum holding of the wafer. At least one sensor such as a limit switch, a touch sensor or a capacitance sensor is mounted in the vacuum dish to detect an aging condition of the seal ring for replacement. The automatic sensing wafer blade can be used in an electrochemical plating process, such as in an acid or alkali tank to pick-up or place wafers in any position. The wafer blade can be used to self-diagnose the wafer vacuum condition and to confirm the wafer transfer safety. The wafer blade can further be used to self-diagnose the vacuum dish V-ring aging condition to determine the necessity for replacement. The wafer blade can further be used to detect when a wafer is stuck on the vacuum blade in order to avoid breakage of wafers.

Figure 1A:
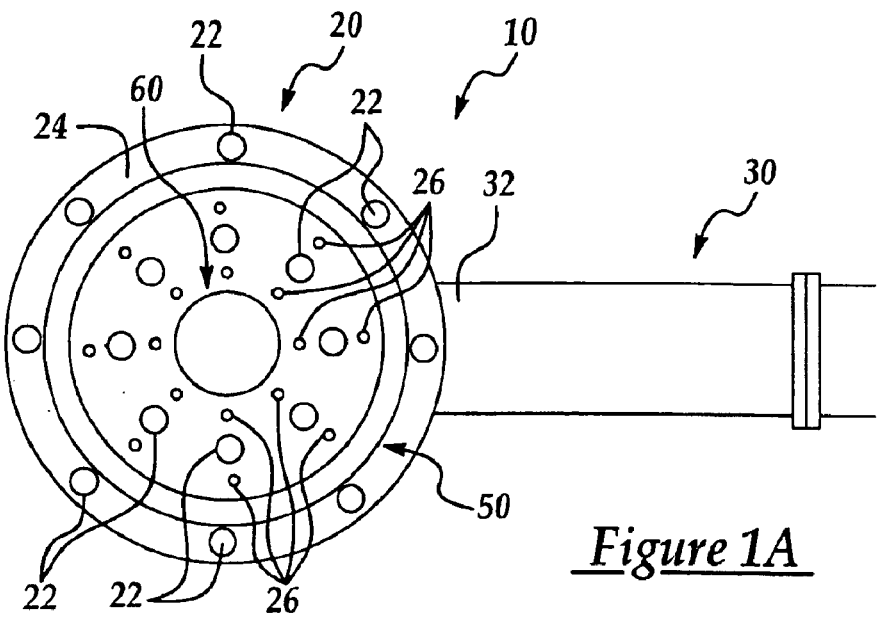
FIG. 1A is a plane view of the present invention automatic sensing wafer blade.
Figure 1B:
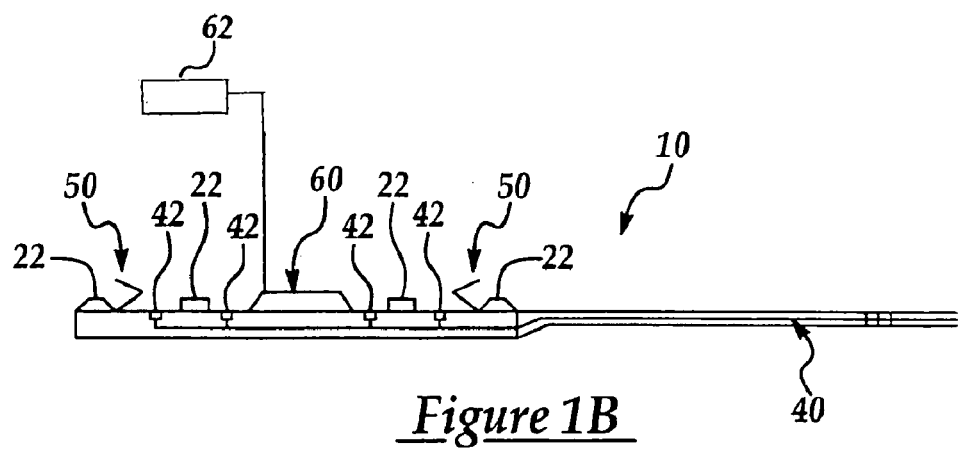
FIG. 1B is a cross-sectional view of the present invention automatic sensing wafer blade of FIG. 1A.

Referring initially to FIG. 1A, wherein a plane view of a present invention automatic sensing wafer blade 10 is shown. The wafer blade 10 is constructed by a blade body 20 of generally circular shape that has a predetermined thickness, and a blade handle 30 of elongated shape that is integrally formed at one end 32 with the blade body 20. The blade handle 30 has a second thickness. The first thickness of the blade body and the second thickness of the blade handle are sufficiently large so as to allow a vacuum passageway 40 (shown in FIG. 1B) to be provided therein for feeding a vacuum to the vacuum port 42.

Figure 1C:
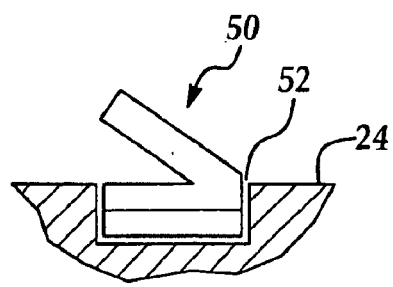
FIG. 1C is an enlarged, cross-sectional view of the V-shaped seal ring used in the present invention automatic sensing wafer blade of FIG. 1A.

The automatic sensing wafer blade 10 is further constructed with a plurality of stops 22 formed on a top surface 24 of the blade body 20 that are circumferentially spaced-apart from each other. The plurality of stops 22 is adapted for contacting a bottom surface of a wafer (not shown). The blade body 20 further consists of a seal ring 50 that is circumferentially positioned on the top surface 24 of the blade body 20, preferentially in a slot opening 52 as shown in FIG. 1C. The V-shaped seal ring 50 is preferably formed of a material that has an elasticity sufficiently large so as to prevent an impact on the wafer during a wafer pick-up process. The V-shaped seal ring 50 can be advantageously formed of an elastomeric material.

The blade body 20 further includes a plurality of vacuum holes 26 in the top surface 24 of the blade body 20 that is situated within the boundary of the seal ring 50.

The blade body 20 is further provided with at least one sensor 60 that is mounted on the top surface 24 of the blade body 20 situated within the seal ring 50 for sensing the presence of a wafer (not shown) positioned on the top surface 24 of the blade body 20. A recording device 62 may further be used to record the status of detection of the wafer on top of the sensor 60.

The seal ring 50 may be advantageously formed in V-shape to provide maximum sealing capability, and can be fabricated of an elastomeric material. The at least one sensor 60 can be either a limit switch, a touch sensor or a capacitance sensor. The seal ring 50, shown in FIG. 1C, should have a height (in an installed position) larger than a thickness of the plurality of stops 22, and larger than the thickness of the at least one sensor 60, to provide maximum sealing capability when a vacuum is applied through the plurality of vacuum holes 26.

The present invention further provides a method for picking up wafers by using an automatic sensing wafer blade which can be carried out by first providing a wafer blade that has a blade body, a blade handle, a plurality of stops on the blade body, a seal ring positioned on the blade body, a plurality of vacuum holes in the blade body, and at least one sensor on the blade body for sensing the presence or absence of a wafer; then withdrawing air from the plurality of vacuum holes while a wafer is positioned on top of the blade body; and monitoring an electronic signal produced by the at least one sensor to verify the proper functioning of the wafer blade. This is shown in FIGS. 2A~2F.

Figure 2A:
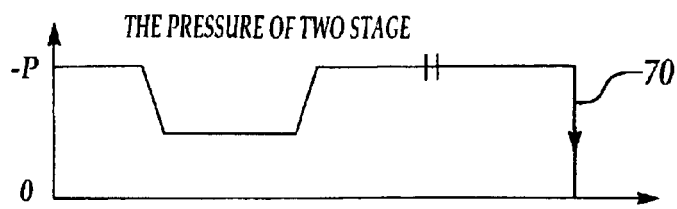
FIG. 2A is a graph illustrating a two-stage application of vacuum pressure in the present invention automatic sensing wafer blade.

Referring now to FIG. 2A, wherein a graph illustrating a contour of a vacuum pressure applied in two separate stages onto the wafer blade is shown. The application of the two-stage vacuum pressure can be accomplished by using a two-stage EV valve to operate the vacuum line 40 (shown in FIG. 1B). The vacuum pressure is shown on the vertical axis in FIG. 2A, while time is shown on the horizontal axis. The vacuum pressure utilized in the present invention novel wafer blade is the factory vacuum pressure that is normally used in a semiconductor fabrication facility, i.e. between about −20 psi and about −40 psi. At the end of the wafer pick-up cycle, the sudden drop 70 in vacuum pressure is indicative of a wafer being released from the wafer blade.

Figure 2B:
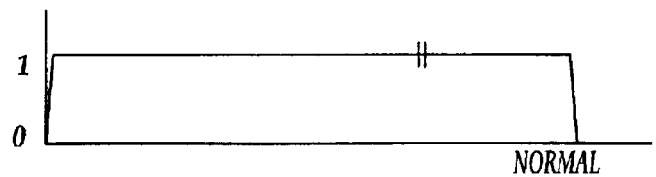
FIG. 2B is a graph illustrating the electronic signal sensed by the sensor during a normal function of the present invention automatic sensing wafer blade.

FIG. 2B illustrates the electronic signal received from the at least one sensor 60 (shown in FIGS. 1A and 1B) plotted vs. time for a normal wafer pick-up condition. In FIG. 2B, "1" indicates an electronic signal indicative of a wafer being sensed, while "0" indicates an electronic signal indicative of no wafer being sensed.

Figure 2C:
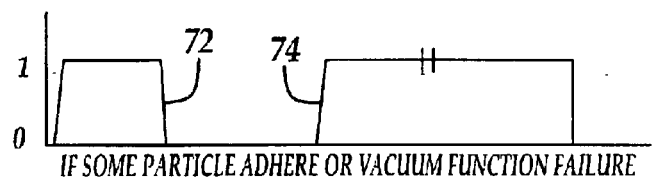
FIG. 2C is a graph illustrating the electronic signal sensed by the sensor in the present invention automatic sensing wafer blade when there is particle contamination on the wafer surface or when there is a vacuum function failure.

FIG. 2C is a plot illustrating when contaminating particles are left on the wafer surface, or when the vacuum function fails such that the wafer is released at 72, and then picked-up again at 74.

Figure 2D:
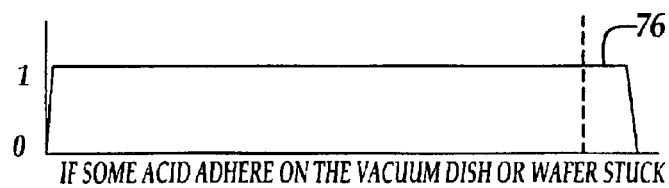
FIG. 2D is a graph illustrating the electronic signal sensed by the sensor of the present invention automatic sensing wafer blade when there is liquid contaminant on the wafer blade and the wafer is stuck on the blade surface.

FIG. 2D is a graph showing the electronic signal produced by the sensor indicative of a condition when liquid contaminants are left on the surface of the wafer such that the wafer is stuck on the wafer blade when it is supposed to have been released. This is shown by the extended plateau section 76.

Figure 2E:
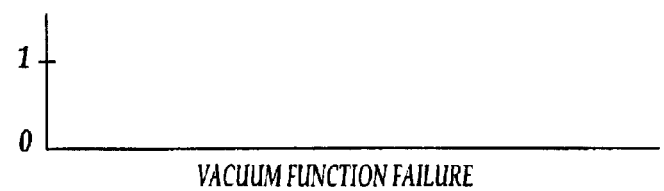
FIG. 2E is a graph illustrating the electronic signal sensed by the sensor in the present invention automatic sensing wafer blade when the vacuum function has failed completely without picking up the wafer.

FIG. 2E indicates a condition wherein a complete vacuum failure has occurred such that the wafer is not pick-up by the wafer blade at all, i.e., there is no signal at "1".

Figure 2F:
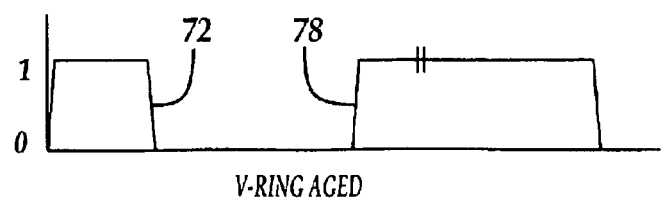
FIG. 2F is a graph illustrating the electronic signal sensed by the sensor in the present invention automatic sensing wafer blade when an aged V-ring that needs replacement is sensed.

FIG. 2F indicates a condition wherein the V-shaped seal ring is aged and needs replacement showing that the vacuum pick-up curve 78 is delayed. When such signals are detected, the V-shaped O-ring should be replaced to prevent a total failure of the wafer blade system.

The present invention novel automatic sensing wafer blade for picking up wafers that is equipped with a sensor capable of self-diagnosing potential failure conditions and a method for using the wafer blade have therefore been amply described in the above description and in the appended drawings of FIGS. 1A~2F.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An automatic sensing wafer blade for picking-up wafers comprising:
    a blade body of generally circular shape having a first thickness;
    a blade handle of elongated shape integral at one end with said blade body, said blade handle having a second thickness;
    a first plurality of stops formed on a top surface of said blade body circumferentially spaced-apart from each other adapted for contacting a bottom surface of a wafer;
    a seal ring circumferentially situated on said top surface of the blade body;
    a second plurality of vacuum holes in said top surface of the blade body situated within said seal ring; said second plurality of vacuum holes in fluid communication with a vacuum passageway in said blade body and said blade handle;
    at least one sensor mounted on said top surface of the blade body situated within said seal ring for sensing the presence of a wafer positioned on said top surface of the blade body; and
    a recording device for recording the status of detection of a wafer on top of said at least one sensor.

2. An automatic sensing wafer blade for picking-up wafers according to claim 1, wherein said seal ring has a V-shaped cross-section.

3. An automatic sensing wafer blade for picking-up wafers according to claim 1, wherein said seal ring has a V-shaped cross-section fabricated of rubber.

4. An automatic sensing wafer blade for picking-up wafers according to claim 1, wherein said at least one sensor is a capacitance sensor.

5. An automatic sensing wafer blade for picking-up wafers according to claim 1, wherein said at least one sensor is a limit switch.

6. An automatic sensing wafer blade for picking-up wafers according to claim 1, wherein said seal ring has a height larger than a thickness of said first plurality of stops.

7. An automatic sensing wafer blade for picking-up wafers according to claim 1, wherein said seal ring has a height larger than a thickness of said at least one sensor mounted on said top surface of the blade body.

8. An automatic sensing wafer blade for picking-up wafers according to claim 1, wherein said first plurality of stops being formed of a material that has an elasticity sufficiently large to prevent the imposition of an impact load onto said wafer during a wafer pick-up process.

9. An automatic sensing wafer blade for picking-up wafers according to claim 1, wherein said first plurality of stops being formed of a rubber material.

10. A method for picking-up wafers by an automatic sensing wafer blade comprising the steps of:
providing a wafer blade having a blade body of generally circular shape, a blade handle of elongated shape integral at one end with said blade body, a first plurality of stops formed on a top surface of said blade body circumferentially spaced-apart from each other adapted for contacting a bottom surface of a wafer, a seal ring circumferentially situated on said top surface of the blade body, a second plurality of vacuum holes in said top surface of the blade body situated within said seal ring; said second plurality of vacuum holes in fluid communication with a vacuum passageway in said blade body and said blade handle, and at least one sensor mounted on said top surface of the blade body situated within said seal ring;
withdrawing air from said second plurality of vacuum holes in two separate steps while positioning a wafer on top of said blade body; and
monitoring an electronic signal produced by said at least one sensor to verify the proper functioning of said wafer blade.

11. A method for picking-up wafers by an automatic sensing wafer blade according to claim 10 further comprising the step of controlling the withdrawing of air from said second plurality of vacuum holes by a two-stage vacuum valve.

12. A method for picking-up wafers by an automatic sensing wafer blade according to claim 10 further comprising the step of providing said first plurality of stops fabricated of a material having sufficient elasticity so as not to impact a wafer during the pick-up process.

13. A method for picking-up wafers by an automatic sensing wafer blade according to claim 10 further comprising the step of providing said first plurality of stops fabricated of an elastomer.

14. A method for picking-up wafers by an automatic sensing wafer blade according to claim 10 further comprising the step of providing said at least one sensor in a limit switch.

15. A method for picking-up wafers by an automatic sensing wafer blade according to claim 10 further comprising the step of providing said at least one sensor in a capacitance sensor.

16. A method for picking-up wafers by an automatic sensing wafer blade comprising the step of:
providing a wafer blade having a blade body of generally circular shape, a blade handle of elongated shape integral at one end with said blade body, a first plurality of stops formed on a top surface of said blade body circumferentially spaced-apart from each other adapted for contacting a bottom surface of a wafer, a seal ring circumferentially situated on said top surface of the blade body, a second plurality of vacuum holes in said top surface of the blade body situated within said seal rifle; said second plurality of vacuum holes in fluid communication with a vacuum passageway in said blade body and said blade handle, and at least one sensor mounted on said top surface of the blade body situated within said seal ring;
testing the sealing efficiency of said seal ring;
withdrawing air from said second plurality of vacuum holes while positioning a wafer on top of said blade body; and
monitoring an electronic signal produced by said at least one sensor to verify the proper functioning of said wafer blade.

17. A method for picking-up wafers by an automatic sensing wafer blade according to claim 16 further comprising the step of testing for particle contamination on said top surface of the blade body.

18. A method for picking-up wafers by an automatic sensing wafer blade according to claim 16 further comprising the step of testing for liquid chemical contamination on said top surface of the blade body.

* * * * *